US 6,680,840 B2

(12) United States Patent
Brooks

(10) Patent No.: US 6,680,840 B2
(45) Date of Patent: Jan. 20, 2004

(54) ELECTRO-MECHANICAL INTERLOCK FOR HOT-SWAPPABLE POWER SUPPLIES AND CARDS

(75) Inventor: Michael Alan Brooks, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 180 days.

(21) Appl. No.: 09/943,704

(22) Filed: Aug. 31, 2001

(65) Prior Publication Data

US 2003/0043561 A1 Mar. 6, 2003

(51) Int. Cl.7 ............................................... H01H 47/00
(52) U.S. Cl. ....................... 361/160; 361/152; 361/170
(58) Field of Search ................................. 361/160, 152, 361/170

(56) References Cited

U.S. PATENT DOCUMENTS 5,841,631 A    11/1998   Shin et al.
6,252,514 B1 * 6/2001   Nolan et al. ............. 340/686.4
6,252,765 B1   6/2001   Balzaretti et al.
6,271,604 B1   8/2001   Frank, Jr. et al.

FOREIGN PATENT DOCUMENTS

GB      2314950        1/1998
JP      2000137937     5/2000

* cited by examiner

Primary Examiner—Stephen W. Jackson

(57) ABSTRACT

A method and apparatus to achieve an electro-mechanical interlock for a hot-swappable component. This invention prevents the misuse and possible damage to the hot-swappable component or the host data processing system due to incorrect insertion or removal of an energized hot-swappable component. One embodiment of the invention involves a method to assemble a hot-swappable power supply with an electro-mechanical interlock into the frame of a data processing system. A second embodiment of the invention involves a method to fabricate an electro-mechanical interlock with a solenoid. A third embodiment of the invention involves a hot-swappable component interlock.

7 Claims, 6 Drawing Sheets

ELECTRO-MECHANICAL INTERLOCK FOR HOT-SWAPPABLE POWER SUPPLIES AND CARDS

BACKGROUND OF THE INVENTION

1. Field of the Invention

This invention relates generally to a mechanism to prevent the removal or the insertion of an electrically activated hot-swappable power supply into a data processing system, and more specifically relates to an electro-mechanical interlock to prevent the removal or the insertion of an electrically activated hot-swappable power supply into a server.

2. Description of the Prior Art

In many data processing systems (e.g., computer systems, programmable electronic systems, telecommunication switching systems, control systems, and so forth) hot-swappable components are desirable in order to allow the data processing system to function during replacement of an individual component. One type of component that is frequently designed for a hot-swappable application is a power supply. This type of power supply is prevalent in redundant data processing systems, or "N+1" systems, where only one power supply is needed for operation, but two power supplies are available in case of the failure of one power supply. One major problem is that an electrically connected and activated power supply should not be inserted into the data processing system, due to the possibility of arcing and other electrical damage to the power supply or another component in the data processing system. Another major problem is that an electrically connected and activated power supply should not be removed from the data processing system for the same reasons, because of the possibility of arcing and other electrical damage to the power supply or another component in the data processing system. Software can sometimes prevent such problems, but not in all cases. A mechanical means of prevention would significantly reduce the risk of this type of damage.

Without an improved design for hot-swappable sub-systems (e.g., power supplies and cards), improper removal or insertion will create an increasing number of electrical failures due to arc damage and other types of electrical overstress, resulting in increasing operational failures and reliability failures. It would be desirable to provide an improved design for hot-swappable sub-systems (e.g., power supplies and cards), to prevent improper removal or insertion of energized hot-swappable components, and prevent the corresponding number of electrical failures due to arc damage and other types of electrical overstress.

SUMMARY OF THE INVENTION

The present invention provides an improved design for hot-swappable components and sub-systems (e.g., power supplies and cards), to prevent improper removal or insertion of energized hot-swappable components, and prevent the corresponding number of electrical failures due to arc damage and other types of electrical overstress.

A first aspect of the invention is directed to a method to replace a swappable component from a frame of a data processing system. The method includes de-energizing the swappable component, wherein the swappable component includes a solenoid having a solenoid pin that engages a mechanical linkage on the frame of the data processing system when the swappable component and the solenoid are energized; waiting for the solenoid pin to retract from the mechanical linkage on the frame of the data processing system after the swappable component and the solenoid are de-energized; and removing the swappable component from the frame of the data processing system.

A second aspect of the invention is directed to a method to fabricate a swappable power supply interlock. The method includes selecting a set of characteristics for a solenoid in the swappable power supply interlock; building a prototype of the swappable power supply interlock; testing the swappable power supply interlock; and determining if an improved set of characteristics is needed for the solenoid in the swappable power supply interlock after testing the swappable power supply interlock.

A third aspect of the invention is directed to a hot-swappable component interlock to a data processing system frame. The hot-swappable component interlock includes a data processing system, including a data processing system frame; a mechanical linkage; a solenoid with a pin, wherein the pin can extend to engage the mechanical linkage, and the pin can retract to disengage from the mechanical linkage; and a hot-swappable component that can be inserted in the data processing system frame when the pin of the solenoid is retracted. The mechanical linkage can be on the data processing system frame with the solenoid on the hot-swappable component, or the mechanical linkage can be on the hot-swappable component with the solenoid on the data processing system frame.

These and other objects and advantages of the invention will become apparent to those skilled in the art from the following detailed description of the invention and the accompanying drawings.

DETAILED DESCRIPTION OF PREFERRED EMBODIMENTS OF THE INVENTION

The present invention provides a method and mechanism for insuring the correct removal or insertion of a hot-swappable component into a data processing system. While the discussion below uses example embodiments of the invention applied to a hot-swappable power supply, other embodiments of the inventions can be applied to other swappable subsystems (e.g., cards, printed circuit boards, and other substrates upon which electrical components can be assembled).

Solenoids with a wide range of characteristics and configurations are easily purchased from commercial solenoid suppliers. Commercial solenoid suppliers include Magnetic Sensor Systems, with corporate headquarters in Van Nuys, Calif.; Densitron Technologies, with corporate headquarters in Santa Fe Springs, Calif.; and Jewell Instruments, with corporate headquarters in Manchester, N.H.

There are several types of solenoids. Solenoid pins or plungers can range in diameter from 0.12 inch (0.3 centimeter) to 1.0 inch (2.54 centimeter). There are linear AC solenoids, linear DC solenoids, rotary AC solenoids, and rotary DC solenoids. The linear solenoids can be further classified as push-type or pull-type. DC solenoids operating at various voltages ranging from 3 volts DC to 24 volts DC, and low power solenoids are readily available. Solenoids in various configurations and temperature ratings are also available for various applications.

An interposer solenoid is a solenoid that specifically allows or prevents a mechanical action, external to the solenoid, from occurring. A pin or plunger is inserted into or retracted from a mechanical linkage, depending upon whether the solenoid is energized or de-energized. However, the normal mode of operation for an interposer solenoid extends a pin (by an internal return spring) when the solenoid is de-energized. Also, the pin could be retracted by using an internal return spring when the solenoid is de-energized by using a pin with a cap on its end (reversed mode of operation). In both cases, the plunger assemblies are captivated and when energized, the solenoids' pin positions are reversed.

A conventional data processing system frame is typically fabricated from a thick, heavy metal and coated with an insulating layer, or fabricated from an expensive thermo-set composite material (e.g., a graphite fiber epoxy composite). A data processing system frame can be fabricated from a stainless steel, a carbon steel alloy, a magnesium alloy, an aluminum alloy, a composite, or a plastic. An extended pin or plunger from a solenoid could mechanically engage a mechanical linkage on a plate in the system frame to prevent removal or insertion of an energized hot-swappable power supply.

Figure 1:
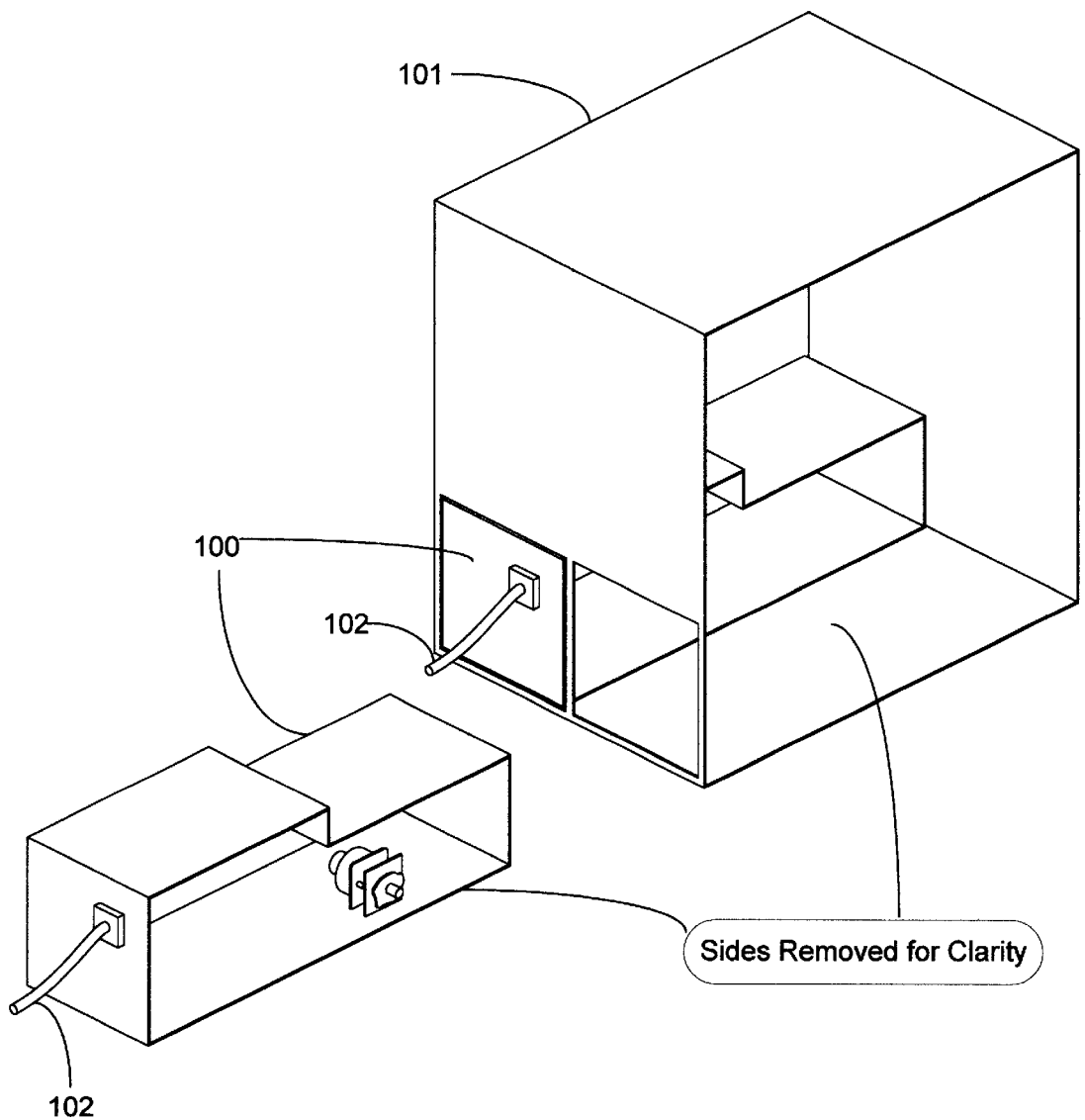
FIG. 1 illustrates a hot-swappable power supply inserted into a data processing system (e.g., a server), in accordance with one preferred embodiment of the invention.

FIG. 1 illustrates one embodiment of a hot-swappable power supply 100 with power cord 102 inserted into a frame, or rack of a frame of a data processing system 101, in accordance with one preferred embodiment of the invention.

Figure 2:
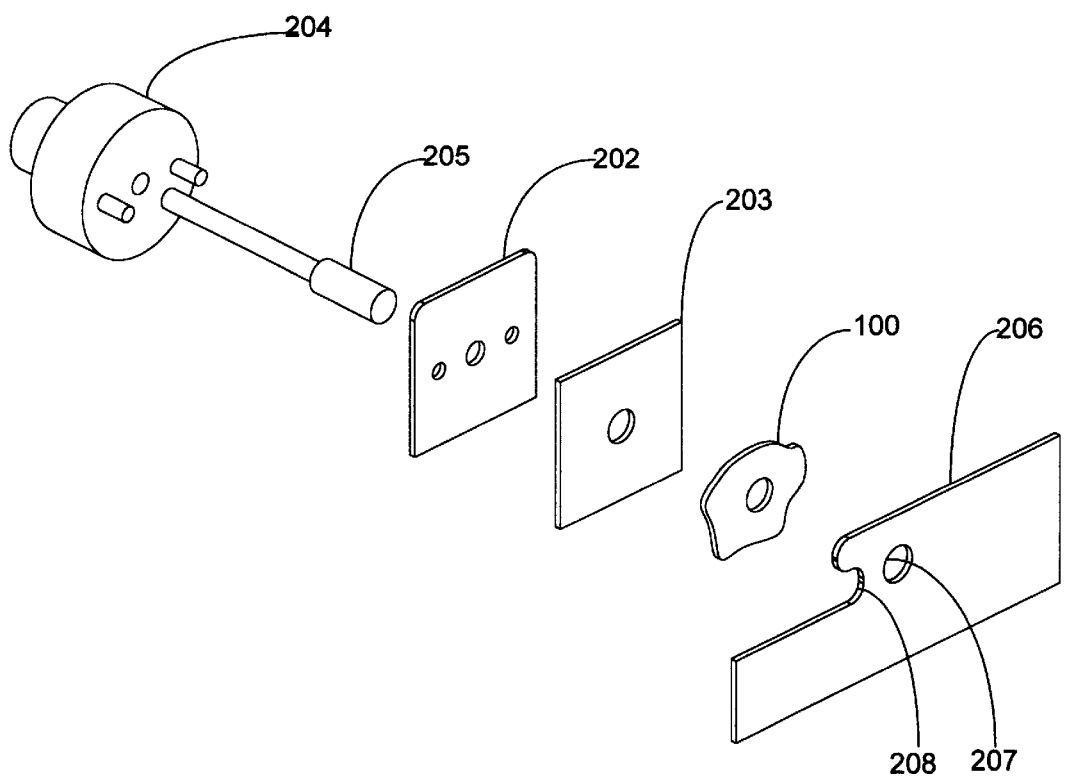
FIG. 2 illustrates in an exploded perspective view one embodiment of a data processing system frame with a plate, and a cavity in the plate; and a hot-swappable power supply with a solenoid and a pin in the solenoid.

FIG. 2 illustrates in an exploded perspective view one embodiment of a data processing system with a hot-swappable power supply 100 (shown as a section of the side wall), including a solenoid mounting plate 202, a pin support plate 203, and a push-type spring-returned solenoid 204 with a pin 205. Also included is an embodiment of the locking/interference plate 206 with a cavity 207 and a notch 208 in a frame of the data processing system 101. The solenoid 204 can be any type of generic, standard solenoid, but in preferred embodiments the solenoid is a normally retracted, push-type solenoid with a spring return. The solenoid operating voltage can range from 3 volts to 24 volts, but preferably uses a low voltage and consumes less than 4 watts in operation, and fully extends a metal pin within 250 milliseconds from the time of initial activation. In preferred embodiments, the solenoid pin or plunger has a diameter ranging from 0.12 inch (0.3 centimeter) to 0.50 inch (1.27 centimeter). In an alternative preferred embodiment, the solenoid pin or plunger actually pushes a stronger pin with an appropriate diameter (preferably less than 1.0 inch (2.54 centimeter)) into the cavity 207 of the locking/interference plate 206.

The locking/interference plate 206 can be fabricated from the following materials: a stainless steel, a carbon steel alloy, a magnesium alloy, an aluminum alloy, a composite, or a plastic. One preferred embodiment of the invention has a plate fabricated from a carbon steel alloy with a galvanized coating. Galvanized carbon steel is corrosion resistant, inexpensive, and easy to form. Galvanized carbon steel also has sufficient strength and stiffness, and would not require any heat treatment. The material does not need to be extremely thick and strong, since the plate 206 only needs to be strong enough to resist the direct and inertial forces created during improper removal or improper insertion of the hot-swappable power supply 100. Therefore, even a locking/interference plate 206 made from a strong plastic or composite can suffice.

Figure 3:
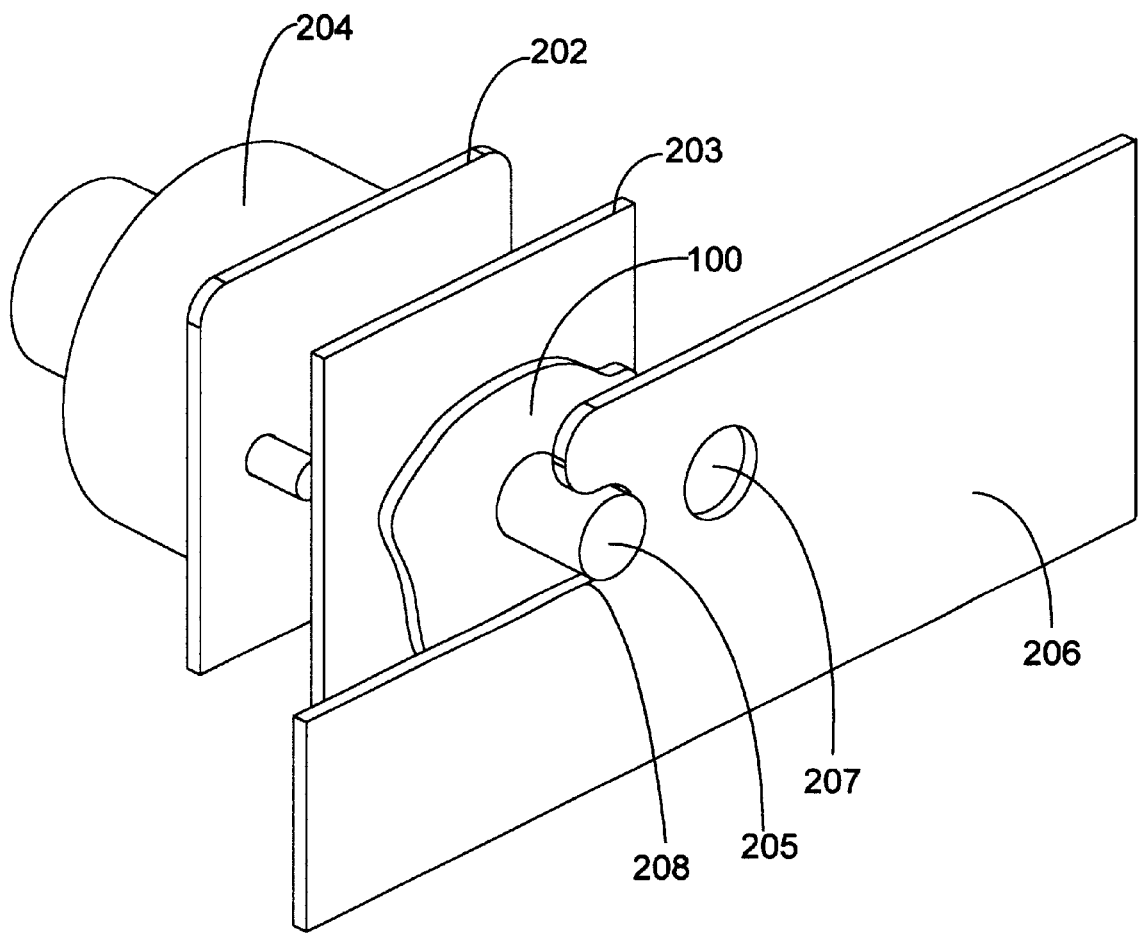
FIG. 3 illustrates in a perspective view one embodiment of a data processing system frame with a plate, and a cavity in the plate; and a hot-swappable power supply with a solenoid with a pin in the energized position causing interference with the cavity in the plate, thus preventing insertion of the power supply into the system frame.

FIG. 3 illustrates in a perspective view one embodiment of a data processing system frame with a locking/interference plate 206, and a cavity 207 and a notch 208 in the locking/interference plate 206; and a hot-swappable power supply 100 with a solenoid 204 with a pin 205. In this embodiment, the solenoid 204 is energized so that pin 205 is extended and interfering with notch 208 in locking/interference plate 206, thus preventing the insertion of power supply 100 into frame of the data processing system 101. The locking/interference plate 206 can be formed at a much lower cost than a conventional machined plate.

Figure 4:
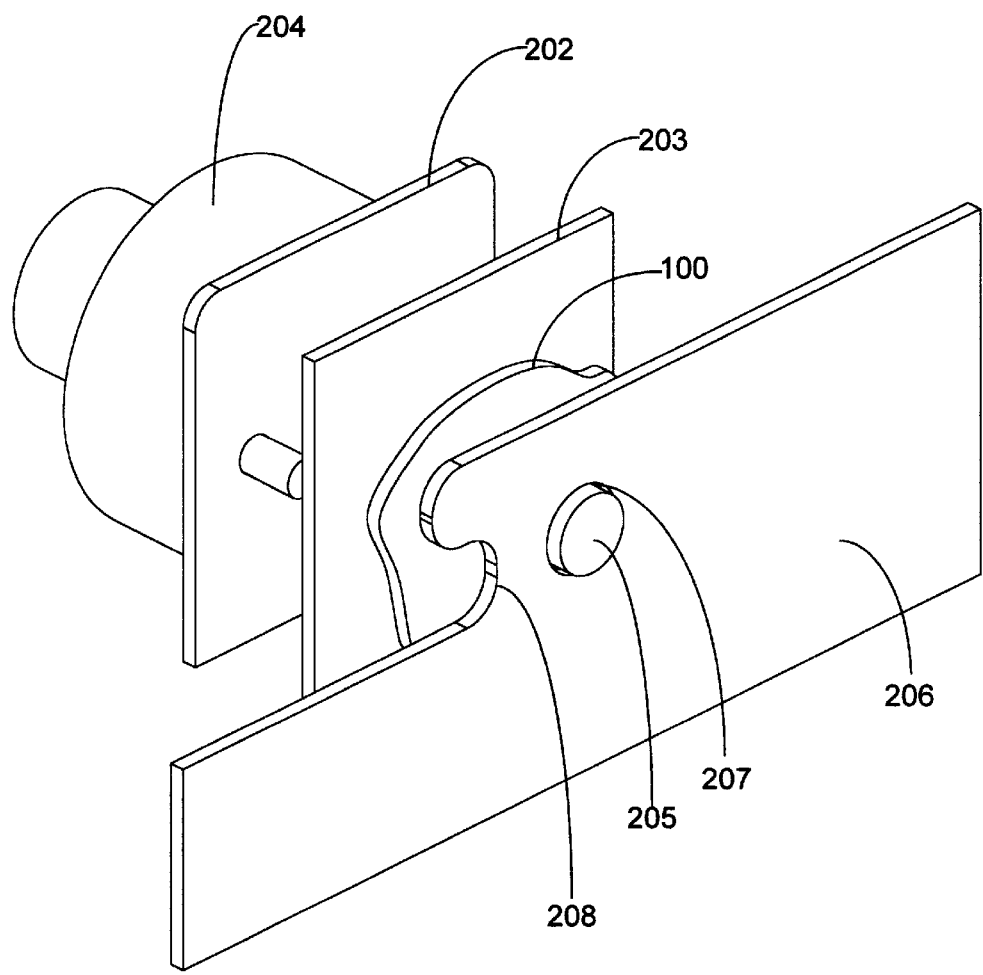
FIG. 4 illustrates in a perspective view the same embodiment of a data processing system frame with a plate, and a cavity in the plate, and a hot-swappable power supply with a solenoid with a pin in the energized position, inserted into the cavity in the plate.

FIG. 4 illustrates in a perspective view the same embodiment shown in FIG. 3 of a data processing system frame with a locking/interference plate 206, and a cavity 207 in the locking/interference plate 206; and a hot-swappable power supply 100 with a solenoid 204 with a pin 205. In this embodiment, the solenoid 204 is energized so that pin 205 is extended and inserts into cavity 207 in locking/interference plate 206, thus preventing removal of the power supply 100 from the data processing system frame 101.

Figure 5:
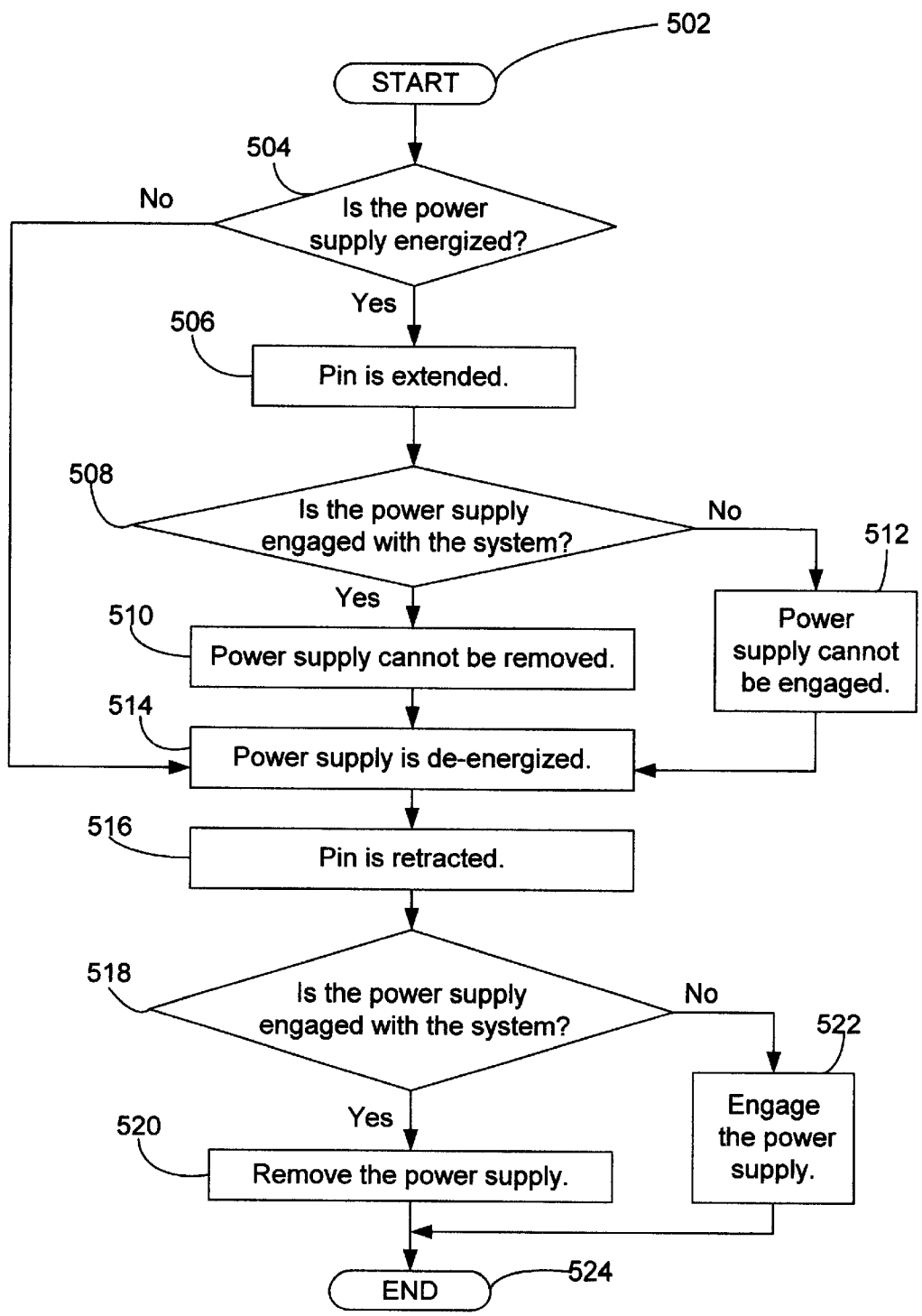
FIG. 5 shows one flow chart for a method to remove a hot-swappable power supply in accordance with one embodiment of the present invention.

FIG. 5 shows one flow chart for a method to remove a hot-swappable power supply in accordance with one embodiment of the present invention. The method starts in operation 502, and is followed by operation 504. In operation 504, test is made to determine if the hot-swappable power supply is energized. In operation 506, since the hot-swappable power supply is energized, the solenoid pin is extended. Operation 508 is next, where a test is made to determine if the hot-swappable power supply is engaged (i.e., the solenoid pin is fully inserted or extended into a mechanical linkage on the frame of the data processing system). If the test of operation 508 determines the hot-swappable power supply is engaged, then operation 510 is next, where the hot-swappable power supply cannot be removed. Then operation 514 is next, where the hot-swappable power supply is de-energized. If the test of operation 508 determines the hot-swappable power supply is not engaged, then operation 512 is next, where the hot-swappable power supply cannot be engaged. Then operation 514 is next, where the power supply is de-energized. Then operation 516 is next, where the pin is retracted. After operation 516, operation 518 is next, where a test is made to determine if the hot-swappable power supply is engaged with the data processing system. If the test of operation 518 determines the hot-swappable power supply is engaged, then operation 520 is next, where the hot-swappable power supply is removed. If the test of operation 518 determines that the hot-swappable power supply is not engaged, then operation 522 is next, where the hot-swappable power supply engages the data processing system. Operation 524 is the end of the method.

Figure 6:
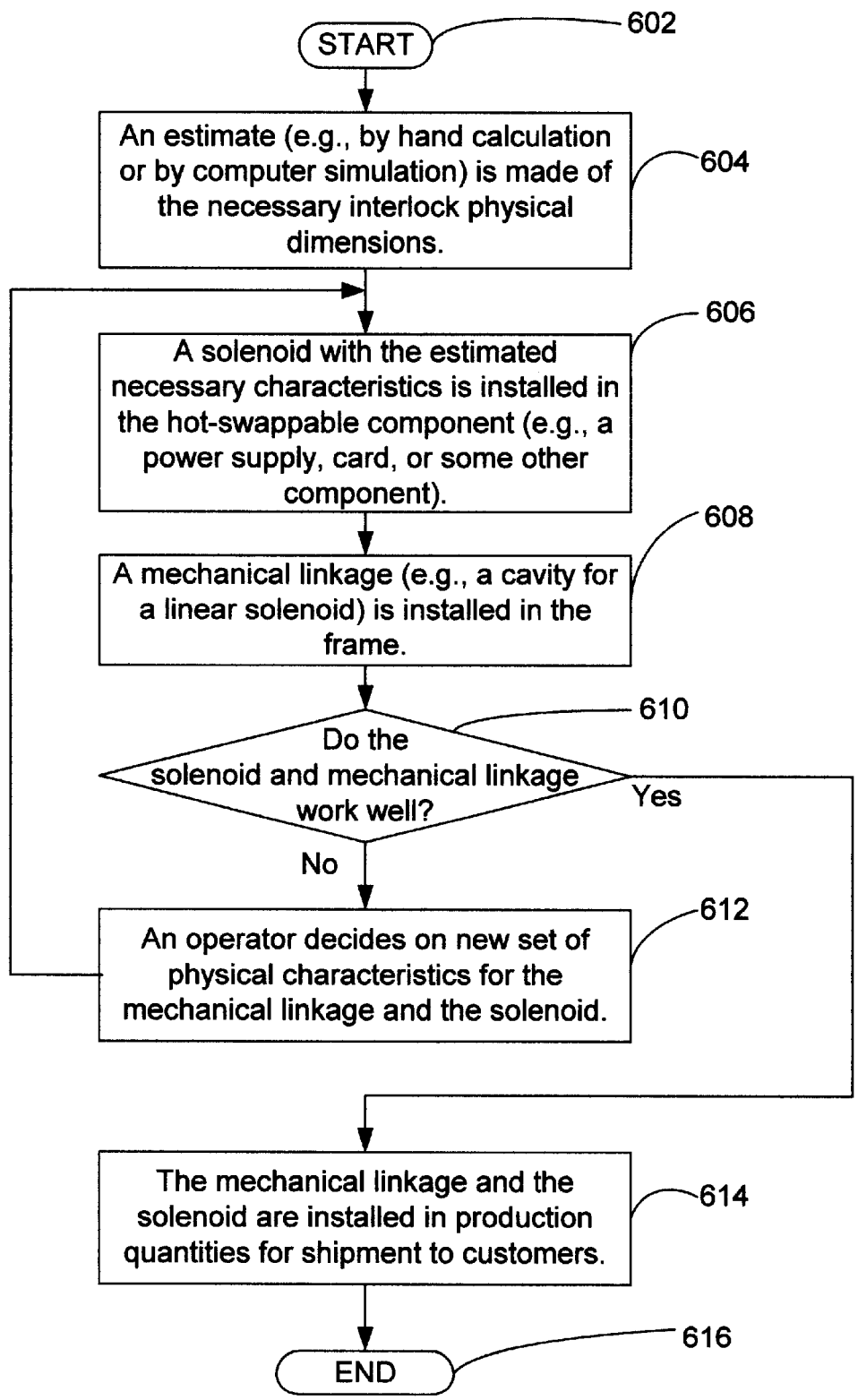
FIG. 6 shows a flow chart for a method to fabricate a hot-swappable power supply interlock in accordance with one preferred embodiment of the present invention.

FIG. 6 shows a flow chart for a method to fabricate a hot-swappable power supply interlock in accordance with one preferred embodiment of the present invention. The method starts in operation 602, and is followed by operation 604. In operation 604, an estimate (e.g., a hand calculation) is made of the physical dimensions needed for the interlock. Then operation 606 is next, where a solenoid (e.g., a low power consumption, push-type solenoid with sufficient pin extension with the appropriate solenoid characteristics) is installed in the hot-swappable power supply. Then operation 608 is next. In operation 608, a mechanical linkage (e.g., a cavity for a linear solenoid, or a rotary latch for a rotary solenoid) is installed in the frame (i.e., frame of the data processing system). In operation 610, a test is made to determine if the solenoid and mechanical linkage are operationally compatible. If the test of operation 610 determines that the mechanical linkage and solenoid are not operationally compatible, operation 612 is next where the operator decides on a new set of physical characteristics for the mechanical linkage and the solenoid. Then operations 606, 608, and 610 are repeated. If the test of the operation 610 determines that the mechanical linkage and solenoid will provide the necessary interlock operation, then operation 614 is next. In operation 614 the mechanical linkage and solenoid are installed in production quantities for shipment to customers. In operation 616 the method ends.

The hot-swappable component interlock is not limited in location to the hot-swappable component. In an alternative embodiment of the invention, the solenoid is on a frame of the data processing system and when the frame is energized, the solenoid on the frame is also energized, and the mechanical linkage is on the hot-swappable component. This embodiment would more easily support the same operations discussed above in regards to a smaller hot-swappable component (e.g., a printed circuit board).

The embodiments of the invention discussed above mainly described examples linear solenoids with pins that retract when de-energized, assembled on hot-swappable power supplies. However, alternative embodiments of the invention can include a rotary solenoid, and can be applied to other hot-swappable components (e.g., various substrates, connectors, or other devices that can cause damage or incur damage if removed while energized).

The exemplary embodiments described herein are for purposes of illustration and are not intended to be limiting. Therefore, those skilled in the art will recognize that other embodiments could be practiced without departing from the scope and spirit of the claims set forth below.

What is claimed is:

1. A method to replace a swappable component from a frame of a data processing system, comprising:
   de-energizing said swappable component, wherein said swappable component includes a solenoid having a solenoid pin that engages a mechanical linkage on said frame of said data processing system when said swappable component and said solenoid are energized;
   waiting for said solenoid pin to retract from said mechanical linkage on said frame of said data processing system after said swappable component and said solenoid are de-energized; and
   removing said swappable component from said frame of said data processing system.

2. The method of claim 1, wherein said swappable component is a power supply.

3. The method of claim 1, wherein said solenoid is a solenoid selected from a group of solenoids consisting of: a linear DC solenoid, a linear AC solenoid, a rotary AC solenoid, and a rotary DC solenoid.

4. The method of claim 1, wherein said frame includes a plate fabricated from a material selected from a group of materials consisting of: a stainless steel, a carbon steel alloy, a magnesium alloy, an aluminum alloy, a composite, or a plastic.

5. The method of claim 1, further comprising:
   inserting a second swappable component into said frame of said data processing system; and
   energizing said second swappable component to extend a solenoid pin from a solenoid installed on second swappable component.

6. The method of claim 1, wherein said solenoid is a push-type solenoid.

7. The method of claim 1, wherein said mechanical linkage on said frame includes one or more cavities in said frame.

* * * * *